United States Patent
Kang et al.

[11] Patent Number: 5,982,671
[45] Date of Patent: Nov. 9, 1999

[54] FLASH MEMORY CELL ARRAY AND METHOD OF PROGRAMMING, ERASING AND READING THE SAME

[75] Inventors: Ho Cheol Kang, Kwacheon-shi; Jong Oh Kim, Sungbuk-ku, both of Rep. of Korea

[73] Assignee: Hyundai Electronics Industries Co., Ltd., Kyungki-do, Rep. of Korea

[21] Appl. No.: 08/997,940

[22] Filed: Dec. 24, 1997

[30] Foreign Application Priority Data

Dec. 28, 1996 [KR] Rep. of Korea ............. 96-74962

[51] Int. Cl.6 ................................. G11C 16/00
[52] U.S. Cl. ................ 365/185.33; 365/185.33; 365/185.27; 365/185.28; 365/185.29; 257/317
[58] Field of Search ............. 365/185.33, 185.18, 365/185.28, 185.27, 185.29; 257/317, 314, 315

[56] References Cited

U.S. PATENT DOCUMENTS

| | | | |
|---|---|---|---|
| 4,763,299 | 8/1988 | Hazani | 365/51 |
| 5,243,559 | 9/1993 | Murai | 365/218 |
| 5,406,514 | 4/1995 | Yoneda | 365/182 |
| 5,413,946 | 5/1995 | Hong | 437/35 |

FOREIGN PATENT DOCUMENTS 0 609 829 A2  8/1994  European Pat. Off. .
2 308 908  7/1997  United Kingdom .

*Primary Examiner*—Tan T. Nguyen
*Attorney, Agent, or Firm*—Scott C. Harris, Esq.

[57] ABSTRACT

The present invention discloses a flash memory array in which four memory cells formed on a silicon substrate having a double well structure hold a source region or a drain region in common so that the area occupied by contact holes can be minimized and integration of device can be enhanced.

7 Claims, 4 Drawing Sheets

FLASH MEMORY CELL ARRAY AND METHOD OF PROGRAMMING, ERASING AND READING THE SAME

FIELD OF THE INVENTION

1. Field of the Invention

The present invention relates to a flash memory cell array and method of programming, erasing and reading the same. In particular, the present invention relates to a flash memory cell array in which four memory cells hold a source region or drain region in common for increasing an integration of stack gate type flash EEPROM device.

2. Description of the Prior Art

In general, a flash memory device having both functions of electrical program and erase and are consisted of peripheral circuit and memory cell array. The memory cell arrays are consisted of a plurality of memory cells which are selected by signals of a word line and a bit line, respectively. And the program operation for storing data into the memory cell is performed by injecting hot electrons into a floating gate. The erase operation for erasing the stored information is performed by discharging the electrons injected into the floating gate. In addition, the memory cell is classified into a stack gate type and a split gate type depending on the type of gate electrode. The flash memory array consisted of a stack gate type memory cells will be explained by reference with FIG. 1. Although, a plurality of memory cells are shown in FIG. 1, only one memory cell will be described for reference.

In a conventional stack gate type memory cell, a pair of field oxide films 1 are formed in isolation regions of a silicon substrate. In a channel region located between the field oxide films, two pair of floating gates 2 which are electrically isolated with the silicon substrate by a tunnel oxide film are formed. Opposite sides of the each floating gate 2 are overlapped to both sides of the field oxide film 1, respectively. A pair of control gates 3 are formed on the field oxide film 1 and the pair of floating gates 2 isolated thereto by a dielectric film, respectively. Drain regions 6 are formed on the silicon substrate between the floating gates 2, and source regions 5 are formed on the silicon substrate which are outer sides of the floating gates 2. Contacts 4 are formed on the drain regions 6, respectively, for connecting to bit lines which are formed to across with the control gates 6.

In the flash memory array having the memory cells as described above, two bits, that is, two memory cells holds one drain region 6 in common, and the drain region 6 is connected to the bit line through a contact hole formed on the contact of the drain region 6. However, since a size of device depends on the size of contact hole and area occupied by the contact hole, it is difficult to enhance the integration of device in case of using the layout constructed as above, and suitably maintain the distance between the control gate 3 and the contact 4, and between the contact 4 and the field oxide film 1.

SUMMARY OF THE INVENTION

It is an object of the present invention to provide a flash memory cell array in which four memory cells formed on a silicon substrate having a double well structure hold a source region or a drain region in common and method of programming, erasing and reading the same.

To achieve the above object, the flash memory cell array according to the present invention comprises a silicon substrate having a double well structure; a plurality of field oxide films formed at isolation regions and arranged in the form of a plurality of rows, the each field oxide film of a row corresponded the space between said field oxide films of adjacent rows and said each field oxide file formed with octagonal shape; a plurality of floating gates formed on said silicon substrate between the field oxide films of adjacent rows, the each floating gate insulated from the silicon substrate by a tunnel oxide film; a plurality of control gates formed on the field oxide films and the floating gates which are formed between the field oxide film and the field oxide film, the each control gate insulated from the each floating gate by a dielectric film; a plurality of source regions formed on the silicon substrate surrounded by adjacent four field oxide films and adjacent four floating gates, the source regions separated from each other by the field oxide film; and a plurality of drain regions formed on the silicon substrate surrounded by adjacent four field oxide films and adjacent four floating gates, the drain regions separated from each other by the field oxide film, whereby the each floating gate is placed between each drain region and each source region so that four memory cells hold the single source region or single drain region in common.

For programming a flash memory cell array according to the invention, a voltage of 8 to 20V is applied to a selected word line, a voltage of 0V is applied to non-selected word lines, and a voltage of 3 to 10V is applied to a selected bit line, a voltage of 0V is applied to bit lines up to the selected bit line and a voltage of 3 to 10V is applied to bit lines from the selected bit line.

For erasing a flash memory cell array, a voltage of −8 to −20V is applied to a selected word line, a voltage of 1 to 10V is applied to a P-well, and a voltage of 1 to 10V is applied to a selected bit line.

Also, for reading a flash memory cell array, a voltage of 3 to 6V is applied to a selected word line, a voltage of 0V is applied to non-selected word lines, and a voltage of 0.5 to 2V is applied to a selected bit line, a voltage of 0V is applied to bit lines up to the selected bit lines, a voltage of 0.5 to 2V is applied to bit lines from the selected bit lines.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF DRAWINGS

The preferred embodiment of the present invention will be explained below by reference to the accompanying drawings.

Figure 1:
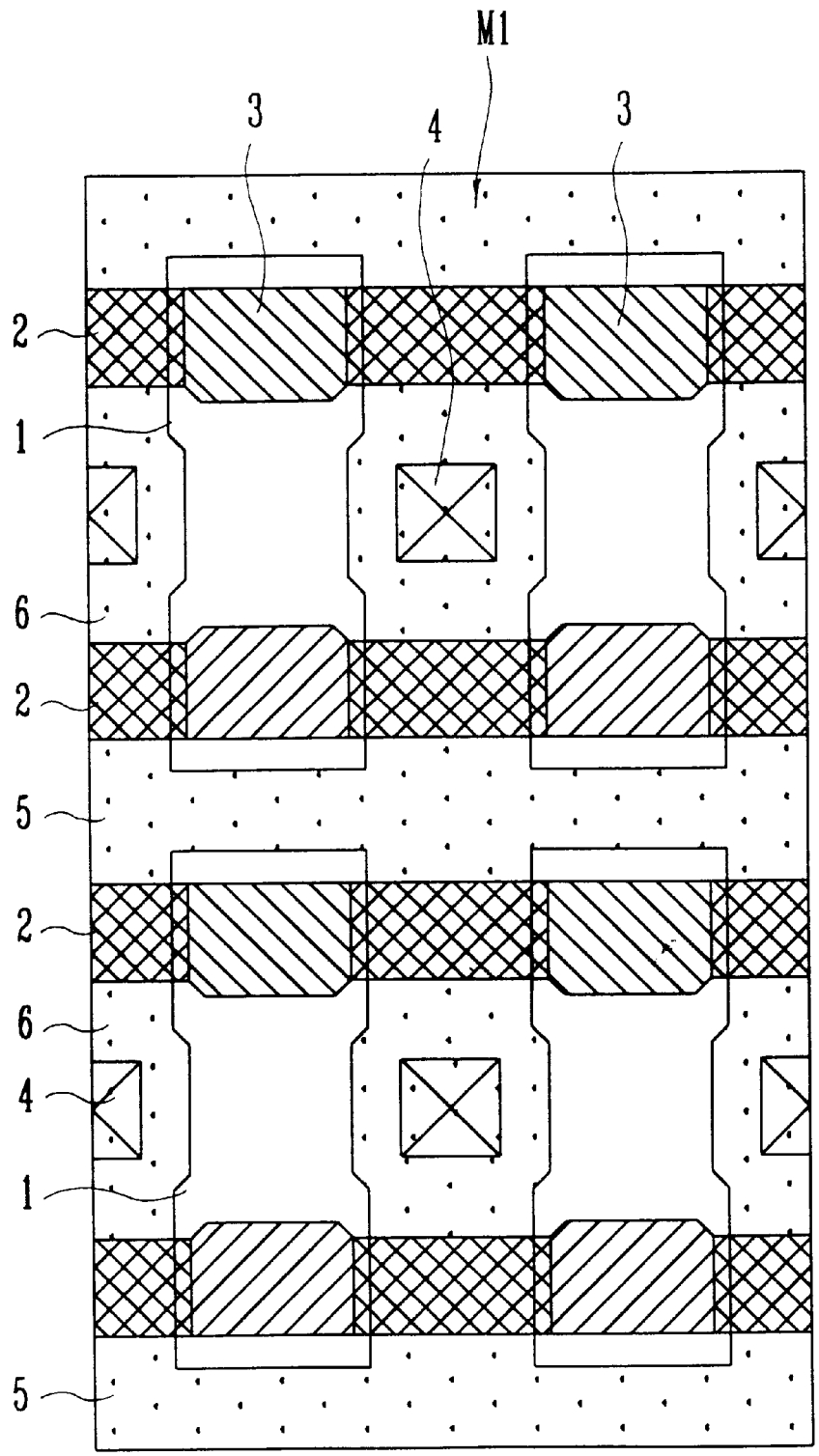
FIG. 1 is a layout for explaining a conventional flash memory cell array.
Figure 2:
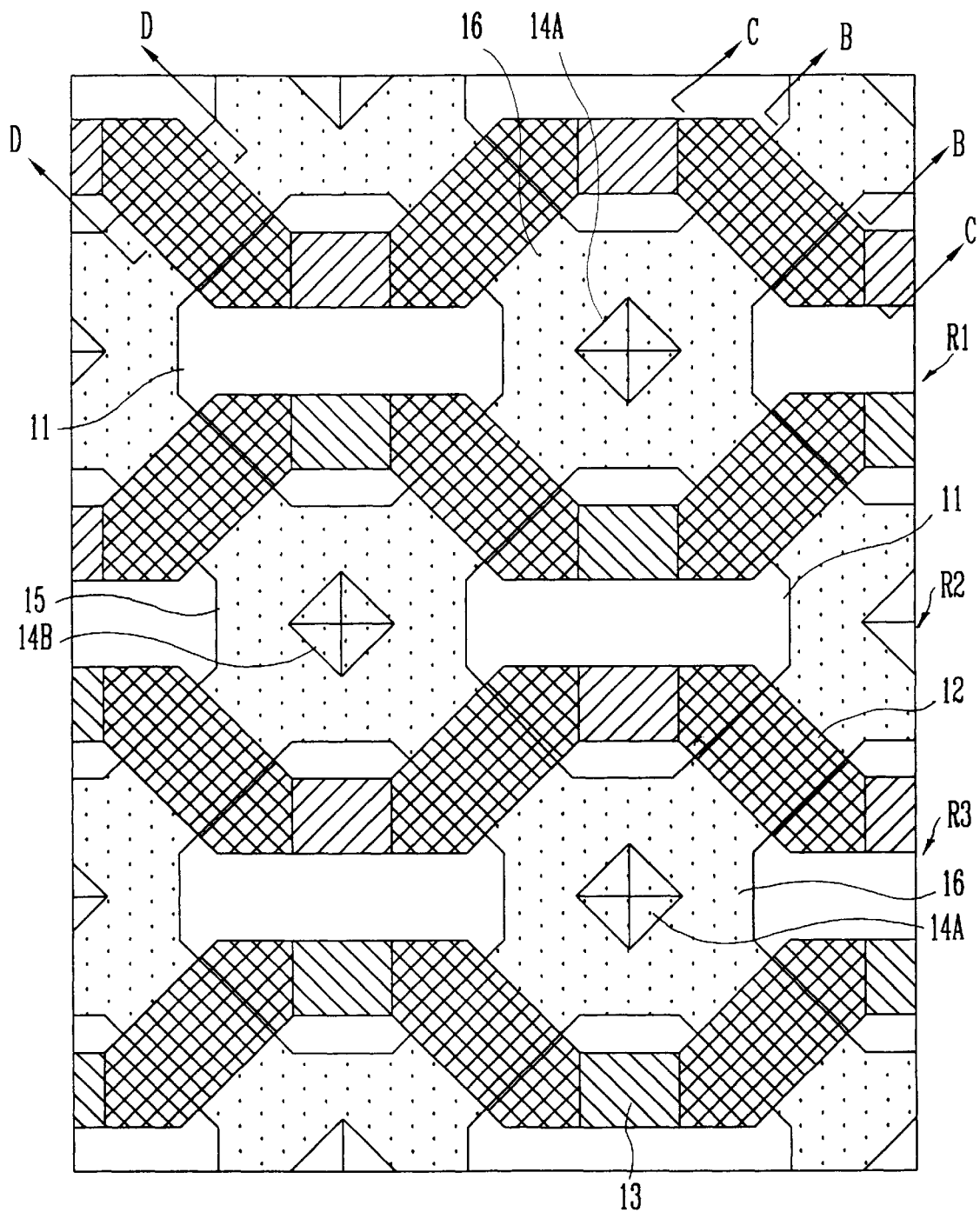
FIG. 2 is a layout for explaining a flash memory cell array according to the present invention.

FIG. 2 is a layout for explaining a flash memory cell array according to the present invention. A plurality of field oxide films 11 composed in polygonal shape, for example, octagonal shape, are formed at isolation regions of a silicon substrate, the field oxide layers 11 are arranged in form of a plurality of rows (for example, R1, R2 and R3). The each field oxide film 11 of each row (for example, R2) corresponds to the space between the field oxide films 11 of adjacent rows (R1 and R3). In order to form the each field oxide film 11, a pad oxide film is formed in thickness of 100 to 200 Å on a silicon substrate having a double well structure, and a nitride film is deposited on the pad oxide film. Then, a portion of the nitride film, on which th field oxide film will be formed, is etched and then the field oxide film is formed in thickness of 3,000 and 10,000 Å through a thermal oxidization process.

Each floating gate 12 is formed between the field oxide film 11 and the field oxide film 11 of an adjacent row, both ends of the each floating gate 12 are overlapped with sides of the field oxide films 11. Therefore, ends of the four floating gates 12 are overlapped with sides of the one field oxide films 11, as shown in FIG. 2. The each floating gate 12 is isolated with the silicon substrate by a tunnel oxide film.

As shown in FIG. 2, the control gates 13 are formed on the floating gates 12 formed between the field oxide layers 11 and the field oxide layers 11 located at both sides of the floating gates 12, therefore two control gates 13 separated from each other are formed on the each field oxide layer 11. The each floating gate 12 is isolated with the each control gate 13 by a dielectric film.

On the other hand, drain regions 16 having a drain contact 14A, respectively are formed on the substrate surrounded by the adjacent four field oxide film 11 and the adjacent four floating gates 12. And, source regions 15 having a source contact 14B, respectively are formed on the substrate surrounded by the adjacent four field oxide film 11 and the adjacent four floating gates 12, Here, the each source region 15 and each drain region 16 are faced each other across to the floating gate 12. That is, the each floating gate 12 is located between the source region 15 and drain region 16, and the each field oxide film 11 is placed between the drain region 16 and another drain region 16 and between the source region 15 and another source region 15. Thus, as shown in FIG. 2, four memory cells hold the single source region 15 or the single drain region 16 in common.

Each part of the memory cell array illustrated in FIG. 2 will be described in order to help understanding of the present invention with reference to FIG. 3A to FIG. 3C.

Figure 3A:
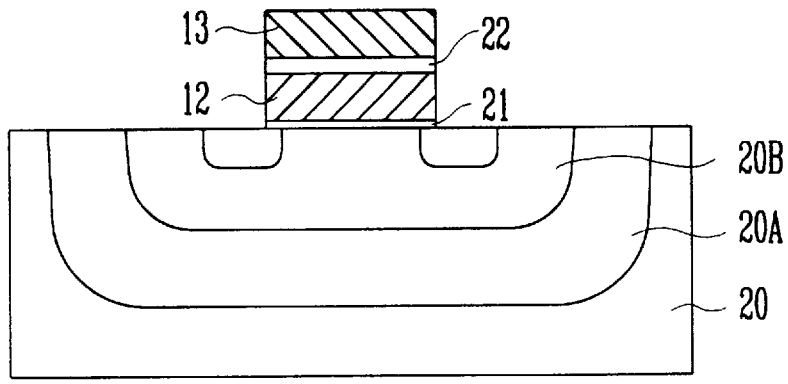
FIG. 3A is a sectional view of a silicon substrate having a double well structure.

Before explaining each section of the flash memory array, the structure of the silicon substrate used in the present invention is described with referenced to FIG. 3A.

In general, a drain, source and channel regions are formed in the P-well of the silicon substrate. However, in the present invention, since the silicon substrate has a double well structure, an erase operation can be performed by applying a bias voltage to a P-well 20B in a N-well 20A. In order to form a silicon substrate having the double well structure, an oxide film (not shown) having a thickness of 250 to 350 Å is formed and grown on the silicon substrate. Then N-type impurity ions are injected into the oxide film and diffused by the thermal process so that a N-well 20A is formed. P-type impurity ions are injected into the N-well 20A and diffused by the thermal process so as to form a P-well 20B. As a result, as the flash memory device has a double well structure in which the P-well 20B is surrounded by the N-well 20A and the N-well 20A is surrounded by the silicon substrate 20.

Figure 3B:
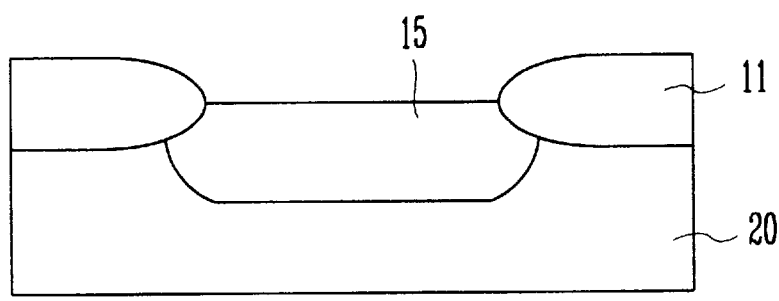
FIGS. 3B to 3D are sectional views taken along lines in FIG. 2.

FIG. 3B is a sectional view taken along line B—B of FIG. 2, the source region 15 is formed on the silicon substrate 20 between the neighboring field oxide films 11.

Figure 3C:
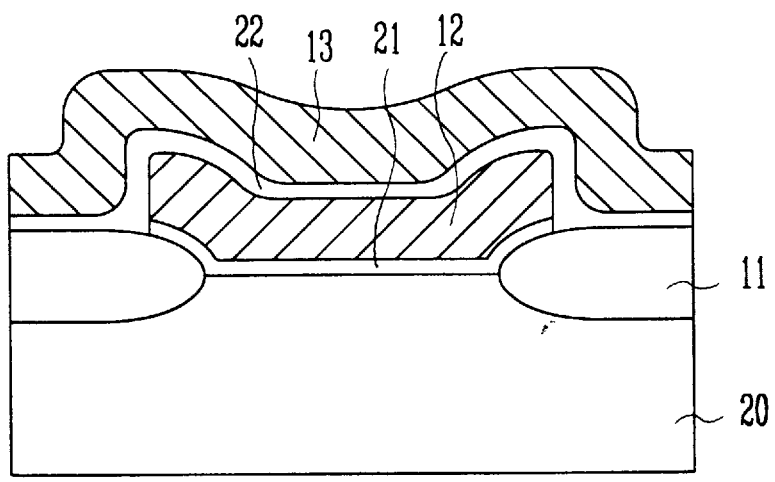

FIG. 3C is a sectional view taken along line C—C of FIG. 2. A tunnel oxide film 21, the floating gate 12 are formed sequentially between the neighboring field oxide films 11. A dielectric film 22 and the control gate 13 are formed sequentially on the entire structure including the floating gate 12.

Figure 3D:
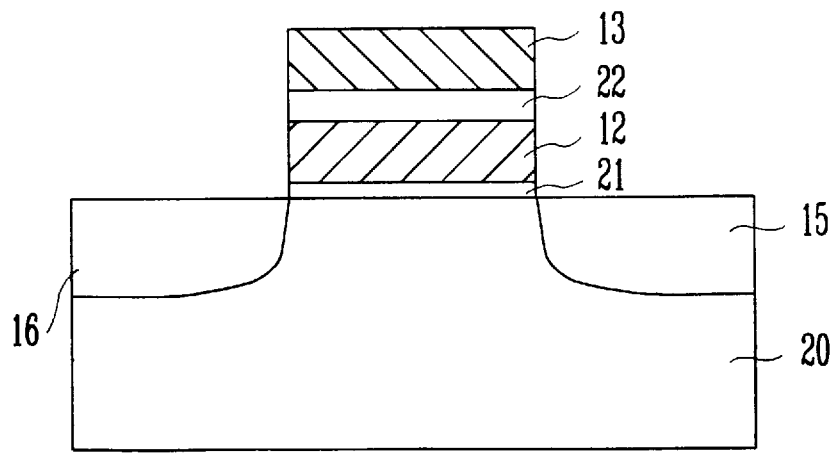

FIG. 3D is a sectional view taken along line D—D of FIG. 2. The tunnel oxide film 21, the floating gate 12, the dielectric film 22 and the control gate 13 are formed sequentially on the silicon substrate 20 between the source region 15 and the drain region 16 so that a gate electrode is formed.

In the flash memory cell array constructed as described above, four bits, that is, four memory cells hold the single source region 15 or the single drain region 16 in common. Therefore, area occupied by contact holes is decreased so that the size of the device can be reduced. Contrary to this, as the size of the field oxide film 11 and the floating gate 12 is increased, electrical insulation and operational characteristics of the device can be enhanced.

Figure 4:
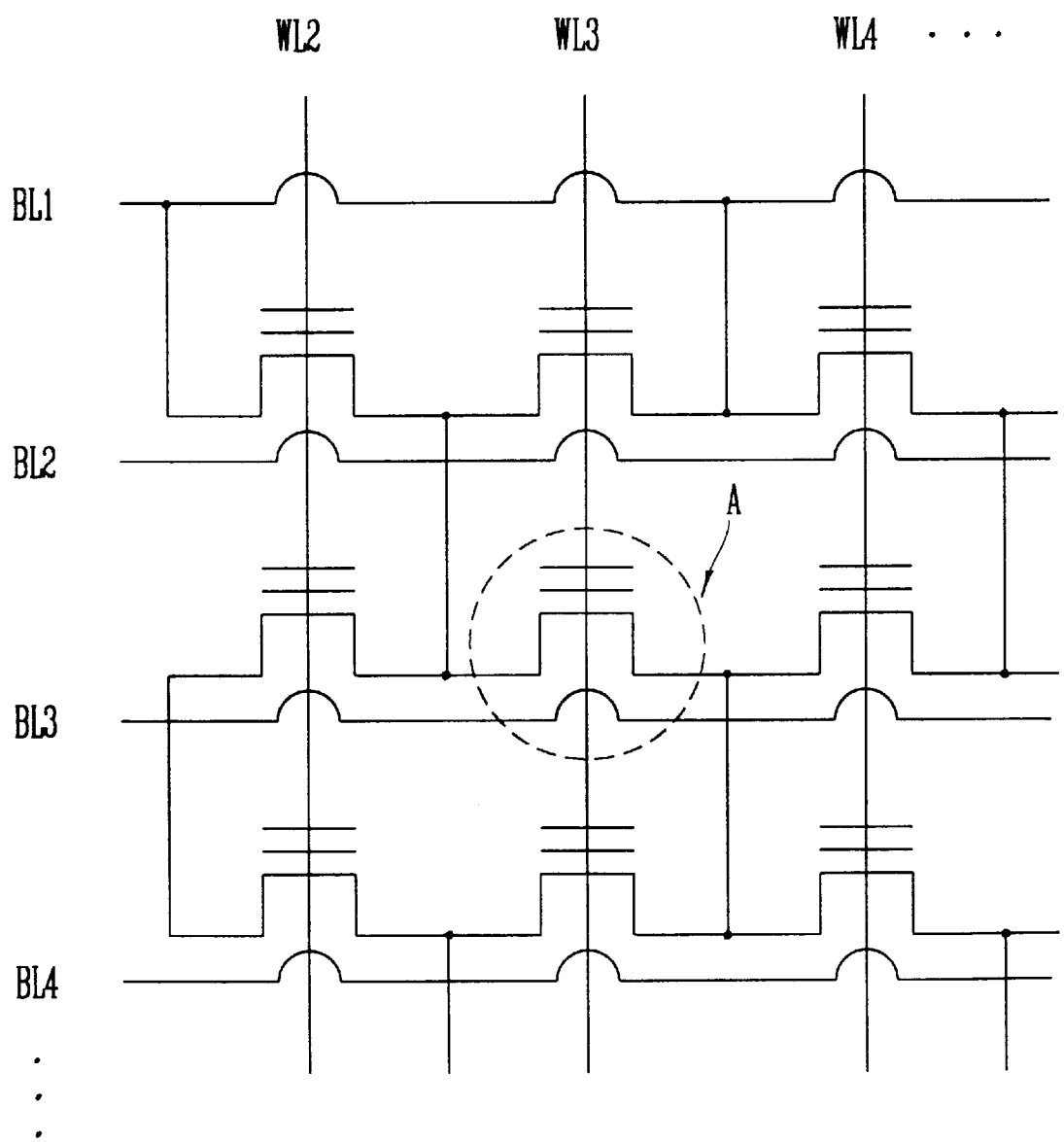
FIG. 4 is a circuit diagram of a memory cell array according to the present invention.

Meanwhile, the flash memory cell array shown in FIG. 2 can be shown as the circuit diagram of FIG. 4. For example, method of programming, erasing and reading the memory cell designated by A in FIG. 4 will be explained as follows.

Program Operation

A voltage of $V_{PG}$ (8 to 20V) is applied to a third word line WL3, a voltage of 0V is applied to another word lines. A voltage of $V_{PD}$ (3 to 10V) is applied to a third bit line BL3, a voltage of 0V is applied to first, second bit lines BL1, BL2, and a voltage of $V_{PD}$ is applied to fourth and fifth bit lines BL4 and BL5. That is, if a $N_{th}$ bit line is selected, a voltage of 0V is applied to the bit lines up to $(N-1)_{th}$ bit line and a voltage of $V_{PD}$ is applied to the bit lines from $(N+1)_{th}$ bit line.

Erase Operation

A voltage of $V_{EG}$ (-8 to -20V) is applied to the third word line WL3 and a voltage of $V_{WELL}$ (1 to 10V) is applied to the P-well. At this time, the third bit line BL3 receives a voltage of $V_{WELL}$ (1 to 10V) or is in floating state.

Read Operation

A voltage of $V_{REF}$ (3 to 6V) is applied to the third word line WL3 and a voltage of 0V is applied to another word lines. A voltage of $V_{READ}$ (0.5 to 2V) is applied to the third bit line BL3, a voltage of 0V is applied to the first and second bit lines BL1 and BL2, and a voltage of $V_{READ}$ is applied to the fourth and fifth bit lines BL4 and BL5. That is, if a $N_{th}$ bit line is selected, a voltage of 0V is applied to the bit lines up to $(N-1)_{th}$ bit line and a voltage of $V_{READ}$ is applied to the bit lines from $(N+1)_{th}$ bit line.

As described above, four memory cells, which are formed on a silicon substrate having a double well structure, hold a source region or drain region in common so that the area occupied the contact holes can be minimized. As a result, an integration of device and characteristic of operation can be enhanced.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory cell array comprising:
   a silicon substrate having a double well structure;
   a plurality of field oxide films formed at isolation regions and arranged in the form of a plurality of rows, said each field oxide film of a row corresponded the space between said field oxide films of adjacent rows and said each field oxide film formed with octagonal shape;

a plurality of floating gates formed on said silicon substrate between said field oxide films of adjacent rows, said each floating gate insulated from said silicon substrate by a tunnel oxide film;

a plurality of control gates formed on said field oxide films and said floating gates which are formed between said field oxide film and said field oxide film, said each control gate insulated from said each floating gate by a dielectric film;

a plurality of source regions formed on said silicon substrate surrounded by adjacent four field oxide films and adjacent four floating gates, said source regions separated from each other by said field oxide film; and a plurality of regions formed on said silicon substrate surrounded by adjacent four field oxide films and adjacent four floating gates, said drain regions separated from each other by said field oxide film whereby said each floating gate is placed between each drain region and each source region so that four memory cells hold said single source region or single drain region in common.

2. A method of programming a memory cell array comprising a silicon substrate having a double well structure, a plurality of field oxide films formed at isolation regions and arranged in the form of a plurality of rows, said each field oxide film of a row corresponded the space between said field oxide films of adjacent rows, a plurality of floating gates formed on said silicon substrate between said field oxide films of adjacent rows, said each floating gate insulated from said silicon substrate by a tunnel oxide film, a plurality of control gates formed on said field oxide films and said floating gates which are formed between said field oxide film and said field oxide film, said each control gate insulated from said each floating gate by a dielectric film, a plurality of source regions formed on said silicon substrate surrounded by adjacent four field oxide films and adjacent four floating gates, said source regions separated from each other by said field oxide film; and a plurality of drain regions formed on said silicon substrate surrounded by adjacent four field oxide films and adjacent four floating gates, said drain regions separated from each other by said field oxide film, whereby said each floating gate is placed between each drain region and each source region so that four memory cells hold said single source region or single drain region in common, is characterized in that a voltage of $V_{pg}$ is applied to a selected word line, a voltage of 0V is applied to non-selected word lines, and a voltage of $V_{pd}$ is applied to a selected bit line, and a voltage of V0 is applied to bit lines up to said selected bit line and a voltage of $V_{pd}$ is applied to bit lines from said selected bit line.

3. The method of claim 2, wherein said voltage of $V_{PG}$ is 8 to 20V, and said voltage of $V_{PD}$ is 3 to 10V.

4. A method of erasing a memory cell array comprising a silicon substrate having a double well structure, a plurality of field oxide films formed at isolation regions and arranged in the form of a plurality of rows, said each field oxide film of a row corresponded the space between said field oxide films of adjacent rows, a plurality of floating gates formed on said silicon substrate between said field oxide films of adjacent rows, said each floating gate insulated from said silicon substrate by a tunnel oxide film, a plurality of control gates formed on said field oxide films and said floating gates which are formed between said field oxide film and said field oxide film and said oxide film, said each control gate insulated from said each floating gate by a dielectric film, a plurality of source regions formed on said silicon substrate surrounded by adjacent four field oxide films and adjacent four floating gates, said source regions separated from each other by said field oxide film; and a plurality of drain regions formed on said silicon substrate surrounded by adjacent four field oxide films and adjacent four floating gates, said drain regions separated from each other by said field oxide film, whereby said each floating gate is placed between each drain region and each source region so that four memory cells hold said single source region or single drain region in common, is characterized in that a voltage of $V_{EG}$ is applied to a selected word line, a voltage of $V_{well}$ is applied to a P-well, and a voltage of $V_{well}$ is applied to a selected bit line.

5. The method of claim 4, wherein said voltage of $V_{EG}$ is −8 to −20V, and said voltage of $V_{WELL}$ is 1 to 10V.

6. A method of reading a memory cell array comprising a silicon substrate having a double well structure, a plurality of field oxide films formed at isolation regions and arranged in the form of a plurality of rows, said each field oxide film of a row corresponded the space between said field oxide films of adjacent rows, a plurality of floating gates formed on said silicon substrate between said field oxide films of adjacent rows, said each floating gate insulated from said silicon substrate by a tunnel oxide film, a plurality of control gates formed on said field oxide films and said floating gates which are formed between said field oxide film and said field oxide film, said each control gate insulated from said each floating gate by a dielectric film, a plurality of source regions formed on said silicon substrate surrounded by adjacent four field oxide films and adjacent four floating gates, said source regions separated from each other by said field oxide film; and a plurality of drain regions formed on said silicon substrate surrounded by adjacent four field oxide films and adjacent four floating gates, said drain regions separated from each other by said field oxide film, whereby said each floating gate is placed between each drain region and each source region so that four memory cells hold said single source region or single drain region in common, is characterized in that a voltage of $V_{REF}$ is applied to a selected word line, a voltage of 0V is applied to non-selected word lines, and a voltage of $V_{READ}$ is applied to a selected bit line, a voltage of 0V is applied to bit lines up to said selected bit lines, a voltage of $V_{READ}$ is applied to bit lines from said selected bit lines.

7. The method of claim 6, wherein said $V_{REF}$ voltage is 3 through 6V, and said $V_{READ}$ voltage is 0.5 through 2V.

* * * * *